United States Patent [19]

Myers

[11] Patent Number: 4,803,094

[45] Date of Patent: Feb. 7, 1989

[54] METALLIZED COATING

[76] Inventor: Richard A. Myers, 1127 Maple Ave., Downers Grove, Ill. 60515

[21] Appl. No.: 191,920

[22] Filed: May 9, 1988

[51] Int. Cl.$^4$ .................. B05D 3/06; C23C 14/02; C23C 14/26

[52] U.S. Cl. ........................... 427/40; 427/124; 427/250; 118/726

[58] Field of Search ............... 427/38, 40, 124, 250; 118/715, 726

[56] References Cited

U.S. PATENT DOCUMENTS 3,607,368 9/1971 Amstel ............................. 427/250
4,544,571 10/1985 Miller ................................ 427/40

OTHER PUBLICATIONS

R. Allen Myers, "An Introduction to Functional Thin Films", presented at the Society of Plastics Engineer's EMI/RFI Symposium, Jun. 1987.

Maissel & Glang, "Handbook of Thin Film Technology", McGraw-Hill Publishing Co., pp. 6-41.

Primary Examiner—Richard Bueker
Assistant Examiner—Roy V. King
Attorney, Agent, or Firm—Wallenstein, Wagner Hattis & Strampel, Ltd.

[57] ABSTRACT

The invention is a method for the vapor deposition of a thin metal film onto a polymeric surface. The method comprises the steps of placing the polymeric surface within a vacuum chamber, and evacuating the chamber to a near-perfect vacuum. The chamber is next filled with argon gas. Sufficient voltage and amperage are applied to the argon gas within the chamber to electrically excite that gas, thereby creating a cloud of free argon electrons which prepare or impart a charge to the polymeric surface. The argon is then evacuated from the chamber, and the chamber is then placed at a suitable plating vacuum. The improvement in the present invention comprises the use of a metal yarn comprised of thin strands of that metal. A conventional electrode, such as a tungsten electrode, disposed within the chamber and wrapped with this yarn is energized sufficiently to rapidly vaporize the metal. The rapidly vaporized metal is transported towards and then coated onto the prepared, charged polymeric surface.

5 Claims, No Drawings

METALLIZED COATING

TECHNICAL FIELD

The present invention relates to functional thin film, metallic coatings that are placed onto substrates for purposes other than mere ornamentation. More particularly, the invention relates to an improved, more rapid method of applying such metallic coatings onto substrates using a metal yarn comprised of a plurality of fine or thin metal strands.

BACKGROUND OF THE INVENTION

The application of functional thin film coatings to substrates is old in the art. Typically, such thin film coatings are applied to plastics to enhance their utility in electrical or electronic environments. The need for such coatings arises from the permeability of conventional materials to interference signals. For example, computer housings, keyboard housings, CATV housings and bezels, electronic radio housings and bezels, and digital telephone housings are frequently made of plastic or polymeric materials. Electronic or electrical equipment contained within unshielded plastic or polymeric housings are all susceptible to the effects of electromagnetic interference (EMI), radio frequency interference (RFI), and electrostatic discharge (ESD).

To protect against the adverse effects of such interference or discharge, the inner surfaces of such housings are typically coated with a thin metal film. Various methods are usable for the deposition of such films. One is conventional vacuum metallizing, which generally uses a lacquer base coat on the plastic substrate to enhance adhesion of the film. Another is functional thin film coating, which is the generic name for the batch process that is the basis of the present invention.

In functional thin film coating, the substrate or part to be coated is generally placed in a fixture mask having individual cells whose shape largely conform to that of the part itself. The substrate is placed within a cell, which covers or shields those portions of the substrate not intended to receive the film coating.

The fixture mask is then placed on a planetary work holding assembly, which is in turn placed in a vacuum chamber. When the system operator has placed the vacuum chamber at a suitable plating vacuum, the vacuum pumping system is shuttered and argon gas is bled into the chamber until a predetermined, designated pressure is attained. The argon is then electrically excited with an appropriate voltage and current, and the excitation causes a cloud of free electrons, or plasma, to form within the vacuum chamber. Upon contact with this plasma, an electrical charge is imparted to the exposed or non-shielded portions of the substrate. In fact, the surface is prepared by a process called glow-discharge cleaning. In this specification, it should be understood that the terms "imparting an electrical charge" and "surface preparation," or their respective equivalents, shall be used interchangeably.

In glow-discharge cleaning, impurities are removed from the surface and other beneficial changes are effected. These beneficial changes on the substrate surface occur as a result of one or more of the following steps: (1) straightforward heating due to impingement of charged particles and their recombination; (2) impurity desorption through electron bombardment; (3) impurity desorption resulting from low-energy ion or neutral-particle bombardment; (4) volatilization of organic residues by chemical reaction with dissociated oxygen; (5) modification of glass surfaces through the addition of oxygen; and (6) enhanced nucleation during subsequent film deposition. From page 6–41 of "Handbook of Thin Film Technology," Maissel and Glang, published by McGraw-Hill.

After a short plasma exposure, the argon gas supply is stopped and the vacuum pumps are unshuttered. Typically, a plurality of tungsten or other suitable metallic, conducting electrodes are provided within the vacuum chamber. Each of the electrodes serves to support one or more small clips or canes fabricated from the desired metal. These clips act as the source of a "plating charge." After the argon gas supply has been stopped and the desired plating vacuum has been attained in the vacuum chamber, an electrical current is supplied to the tungsten electrodes. In time, the current causes the small metal clips to evaporate. The resultant evaporated metal migrates toward and is deposited upon the prepared or charged, exposed surface of the substrate. Upon deposition, the metal cools to form a thin metal film coating on the substrate.

Finally, chamber vacuum is broken, the planetary work holding assembly is removed, and a new batch process may be initiated.

Among the metals that have been applied by functional thin film coating are aluminum, aluminum alloyed with other metals, and stainless steel. More than one layer of thin film may be deposited on a substrate. Such multiple-layer thin films are useful in hostile environments. For example, copper thin films may be most suitable in environments where the substrate is subject to the deleterious effects of abrasion, chemical attack, or moisture. The copper, however, may be undesirably corroded adjacent the porous surfaces of polymeric substrates. Thus, an insulating base, thin film of stainless steel is applied directly to the substrate, and the copper thin film is applied over this stainless steel base film layer.

One method for the deposition of a chromium or stainless steel composite layer is described in U.S. Letters Pat. No. 4,544,571, issued to Walter J. Miller on Oct. 1, 1985, and entitled "Method of Manufacture of EMI/RFI Vapor Deposited Composite Shielding Panel."

SUMMARY OF THE INVENTION

The present invention is a method for the vapor deposition of a thin metal film onto a polymeric surface. The method comprises the steps of placing the polymeric surface within a vacuum chamber, and evacuating the chamber to a near-perfect vacuum. The chamber is next filled with argon gas. Sufficient voltage and amperage are applied to the argon gas within the chamber to electrically excite that gas, thereby creating a plasma, or a cloud of free argon electrons which prepares or imparts a charge to the polymeric surface. Next, the argon is evacuated from the chamber, and the chamber is placed at a suitable plating vacuum.

The improvement in the present invention comprises the use of a metal yarn comprised of thin strands of that metal. A conventional electrode, such as a tungsten electrode, disposed within the chamber and wrapped with this yarn is energized sufficiently to rapidly vaporize the metal. The rapidly vaporized metal is transported towards and then coated onto the charged or prepared polymeric surface. Upon condensation of the vaporized metal, a uniform thin film is deposited onto the substrate.

The metal yarn used in the preferred embodiment is comprised of 316L-grade stainless steel. As indicated above, the yarn is made of a plurality of strands; each of the strands preferably has a diameter not exceeding 20 microns. In the most preferred embodiments of the present method, these strands have diameters of eight (8) and twelve (12) microns, respectively.

There are several advantages to using yarn having thin strands of 316L-grade stainless steel for vapor deposition. First, 316L-stainless steel is approved by the federal Food and Drug Administration for use in connection with food processing and handling. Second, the thin strands evaporate much more rapidly than the metal clips or canes previously used, resulting in a shorter batch processing time. Third, the rapid vaporization of the thin strands of metal results in a uniform deposition of the stainless steel on the surface of the substrate.

DETAILED DESCRIPTION OF THE PREFERRED EMBODIMENT

As indicated above, the thin-film vapor deposition process of the present invention is generally similar to a process well-known in the art. The invention lies in the use of a very thin yarn comprised of thin strands of 316L-stainless steel. By using the yarn comprised of these strands, and by applying a suitable voltage across the tungsten or other metal electrodes on which the yarn is carried within the vacuum chamber, rapid evaporation of the stainless steel occurs and uniform deposition of the stainless steel on the substrate is assured. Because the fine yarn is typically vaporized and the resulting vapor is deposited on the substrate within four to five seconds after the energization of the electrode, a uniform thickness of metal is deposited on the substrate.

The method of the present invention may best be understood by the following illustrative example. It will be understood by those skilled in the art that this example is only intended to be exemplary of the invention rather than limiting. The only limitations placed upon the invention are set forth in the claims at the end of this specification.

EXAMPLE

In functional thin film coating in accordance with the present invention, a substantially oval polymeric food containing dish was used. The dish was made of polyethylene, but polypropylene is also a suitable material for a substrate in this invention. It will be understood by those skilled in the art that suitable substrates are not limited to food containers or to objects of any particular size or shape. In fact, containers of any size or shape may be coated by vapor deposition by exposing their surfaces to the vaporized metal in accordance with this invention.

As indicated above, the oval food container to be metal-coated is placed in a fixture mask having individual cells whose shape largely conform to that of the container itself. The oval food container used for this Example is intended for use in microwave ovens. The metal coating is selectively placed on those surfaces of the container which contact the food during warming in the oven. As the food is warmed, the metal coating becomes sufficiently heated to brown the bottom of the food product. This application is ideal for microwavable cakes, pizzas, and the like.

Accordingly, the oval container is to be coated along its inner, bottom surface. The fixture mask is thus formed to cover the entire exterior surface of the oval container, and most of the inner walls of that container. In this way, only the bottom surface and a small, adjacent portion of the inner walls of the container will be ultimately coated.

The fixture mask and the oval food container are then placed on a planetary work holding assembly, which is in turn placed in a vacuum chamber. The vacuum chambers suitable for the present invention are typically at least twenty-four (24) inches in length. For this Example, the vacuum chamber used was the Model 426-6, manufactured by the Stokes Division of the Pennwalt Corporation, Philadelphia, Pennsylvania. The vacuum chamber system operator places the vacuum chamber at a suitable plating vacuum, typically $4 \times 10^{-5}$ torr. The vacuum pumping system is then shuttered, and argon gas is bled into the chamber until a foreline pressure of 100 microns is attained.

The argon is then electrically excited with a 100 volts of power at 1 ampere for approximately five (5) minutes. The resultant excitation of the argon gas causes a cloud of free electrons, or a plasma, to form within the vacuum chamber. Upon contact with this plasma, the surface is prepared by an electrical charge which is impated to the exposed or non-shielded portions of the oval food container. After a short plasma exposure, the argon gas supply is stopped and the vacuum pumps are unshuttered.

Typically, a plurality of tungsten or other suitable metallic, conducting electrodes are provided within the vacuum chamber. In this specific embodiment and Example, fourteen tungsten filaments or electrodes are utilized. Spirally wound around each of the electrodes is a relatively short piece of the 316L-stainless steel yarn. Each length of yarn is typically four to five (4-5) inches long, and is comprised of twelve thousand (12,000) strands, each eight (8) microns in diameter. Suitable 316L-stainless steel wire used in this Example was obtained from Bekaert Steel Wire Corporation, 1770 The Exchange, Suite 130, Atlanta Ga. 30339.

As indicated above, each of the electrodes serves to support a length of this stainless steel wire or yarn. This yarn acts as the source of a "plating charge." After the argon gas supply has been stopped and the desired plating vacuum has been attained in the vacuum chamber, the tungsten electrodes are energized with sufficient voltage and current to cause them to glow. In this Example, five hundred (500) amperes at three (3) volts of power was initially used. When the tungsten electrodes had attained a uniform, red color, then the power was increased to seven hundred fifty (750) amperes at four (4) volts. When deposition of the metal begins on the substrate, the power is increased to one thousand (1000) amperes at five (5) volts. Finally, when the metal that is deposited betwen the tungsten filaments begins to melt and clear away from the space between those filaments, the power is reduced to seven hundred (700) amperes at three (3) volts, and retained there for approximately fifteen seconds in a cool-down operation.

This entire process causes the 316L-stainless steel yarn to evaporate. The resultant evaporated metal migrates toward and is deposited upon the prepared or plasma-charged, exposed surface of the food container. Upon deposition, the metal cools to form a thin, uniform stainless steel film coating on the food container.

An advantage inherent in the present invention is that irregularities in an otherwise flat surface receive the same uniform coating depth as the flat surface itself. This advantage is important in the deposition of the coating on food containers such as used in the present Example. Occasionally, the manufacturer of the food product will have the inner bottom surface of the polymeric food containers embossed with either its trademark or another graphic element. When the present method is used, the depth of the coating on the raised, embossed portion equal to the depth of the coating on the inner bottom surface.

When the evaporated metal has contacted the food container and condensed onto its surface, the process is finished. The chamber vacuum may be broken, the planetary work holding assembly removed, and the system is ready for the initiation of a new batch process.

What I claim is:

1. A method for the vapor deposition of a thin metal film onto a polymeric surface, comprising:
   (a) placing said polymeric surface within a vacuum chamber;
   (b) evacuating said vacuum chamber to a nearperfect vacuum;
   (c) filling said chamber with argon gas;
   (d) applying sufficient voltage and amperage to the argon gas in said chamber to electrically excite said argon gas, thereby creating a cloud of free argon electrons which prepares and imparts a charge to said polymeric surface;
   (e) evacuating said argon from said chamber, and placing said chamber at a suitable plating vacuum;
   (f) energizing an electrode disposed within said chamber and wrapped with a yarn comprised of a plurality of thin strands of said metal, said electrode being energized sufficiently to vaporize said metal, whereby said vaporized metal is transported towards and coated onto said prepared, charged polymeric surface.

2. The method as set forth in claim 1, wherein said metal yarn is comprised of 316L-grade stainless steel.

3. The method as set forth in claim 1, wherein each of said strands are of a diameter not exceeding 20 microns.

4. The method as set forth in claim 2, wherein each of said strands are of a diameter not exceeding 20 microns.

5. A method for the vapor deposition of a thin stainless steel film onto a polymeric surface, comprising:
   (a) placing said polymeric surface within a vacuum chamber;
   (b) evacuating said vacuum chamber to a near-perfect vacuum;
   (c) filling said chamber with argon gas;
   (d) applying sufficient voltage and amperage to the argon gas in said chamber to electrically excite said argon gas, thereby creating a cloud of free argon electrons which prepares and imparts a charge to said polymeric surface;
   (e) evacuating said argon from said chamber, and placing said chamber at a suitable plating vacuum;
   (f) energizing an electrode disposed within said chamber and wrapped with a 316L-grade stainless steel yarn comprised of a plurality of thin strands of said stainless steel, each of said strands having a diameter not exceeding 20 microns, said electrode being energized sufficiently to vaporize said stainless steel, whereby said vaporized stainless steel is transported towards and coated onto said prepared, charged polymeric surface.

* * * * *